United States Patent
Yahagi et al.

(10) Patent No.: US 8,882,975 B2
(45) Date of Patent: *Nov. 11, 2014

(54) SB-TE BASE ALLOY SINTER SPUTTERING TARGET

(75) Inventors: Masataka Yahagi, Ibaraki (JP); Hideyuki Takahashi, Ibaraki (JP); Hirohisa Ajima, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 768 days.

This patent is subject to a terminal disclaimer.

(21) Appl. No.: 12/444,859

(22) PCT Filed: Oct. 5, 2007

(86) PCT No.: PCT/JP2007/069550
§ 371 (c)(1),
(2), (4) Date: Apr. 21, 2009

(87) PCT Pub. No.: WO2008/044626
PCT Pub. Date: Apr. 17, 2008

(65) Prior Publication Data
US 2009/0301872 A1  Dec. 10, 2009

(30) Foreign Application Priority Data
Oct. 13, 2006 (JP) .................. 2006-279416

(51) Int. Cl.
*C23C 14/00* (2006.01)
*C25B 9/00* (2006.01)
(Continued)

(52) U.S. Cl.
CPC ............. *C23C 14/3414* (2013.01); *C22C 28/00* (2013.01); *C22C 1/05* (2013.01); *B22F 2998/10* (2013.01); *C23C 14/0623* (2013.01); *C22C 12/00* (2013.01); *G11B 7/266* (2013.01)
USPC .................. 204/298.13; 204/298.12; 75/228; 419/23; 420/576; 420/579

(58) Field of Classification Search
USPC ............. 204/298.13, 298.12; 75/228; 419/23; 420/576, 579
See application file for complete search history.

(56) References Cited

U.S. PATENT DOCUMENTS 5,736,657 A * 4/1998 Ide et al. .................... 75/230
5,882,493 A * 3/1999 Iwasaki et al. ......... 204/298.13
(Continued)

FOREIGN PATENT DOCUMENTS

EP  1220214 A1  7/2002
EP  1394284 A1  3/2004
(Continued)

OTHER PUBLICATIONS

One page English Abstract of JP 2000-265262, Sep. 26, 2000.
(Continued)

*Primary Examiner* — Michael Band
(74) *Attorney, Agent, or Firm* — Howson & Howson LLP

(57) ABSTRACT

Provided is an Sb—Te base alloy sinter sputtering target having Sb and Te as its primary component and comprising a structure in which Sb—Te base alloy particles are surrounded by fine carbon or boron particles; wherein, if the mean diameter of the Sb—Te base alloy particles is X and the particle size of carbon or boron is Y, Y/X is within the range of 1/10 to 1/10000. The present invention seeks to improve the Sb—Te base alloy sputtering target structure, inhibit the generation of cracks in the sintered target, and prevent the generation of arcing during the sputtering process.

12 Claims, 1 Drawing Sheet

(51) Int. Cl.
*C25B 11/00* (2006.01)
*C25B 13/00* (2006.01)
*B22F 1/00* (2006.01)
*B22F 3/00* (2006.01)
*C22C 1/00* (2006.01)
*C22C 1/04* (2006.01)
*C22C 12/00* (2006.01)
*C22C 28/00* (2006.01)
*C22C 1/05* (2006.01)
*C23C 14/34* (2006.01)
*C23C 14/06* (2006.01)
*G11B 7/26* (2006.01)

(56) References Cited

U.S. PATENT DOCUMENTS

| | | | |
|---|---|---|---|
| 7,017,382 | B2 | 3/2006 | Segal et al. |
| 7,156,964 | B2 | 1/2007 | Yahagi et al. |
| 7,311,874 | B2 * | 12/2007 | Zhang ............... 419/32 |
| 7,484,546 | B2 | 2/2009 | Yahagi et al. |
| 7,803,209 | B2 * | 9/2010 | Takahashi ............... 75/228 |
| 7,943,021 | B2 | 5/2011 | Takahashi |
| 7,947,106 | B2 * | 5/2011 | Takahashi ............... 75/255 |
| 2001/0047838 | A1 | 12/2001 | Segal et al. |
| 2004/0208774 | A1 | 10/2004 | Zhang |
| 2005/0031484 | A1 * | 2/2005 | Nonaka et al. ............... 420/579 |
| 2007/0297938 | A1 | 12/2007 | Takahashi |
| 2009/0071821 | A1 | 3/2009 | Takahashi |
| 2010/0206724 | A1 | 8/2010 | Takahashi |
| 2011/0017590 | A1 | 1/2011 | Fukuyo et al. |
| 2012/0097530 | A1 | 4/2012 | Takahashi |
| 2012/0279857 | A1 | 11/2012 | Takahashi et al. |
| 2012/0286219 | A1 | 11/2012 | Ikisawa et al. |

FOREIGN PATENT DOCUMENTS

| | | | |
|---|---|---|---|
| JP | 03-162570 A | | 7/1991 |
| JP | H10-81962 A | | 3/1998 |
| JP | 2000-129316 A | | 5/2000 |
| JP | 2000-169960 A | | 6/2000 |
| JP | 2000-265262 A | | 9/2000 |
| JP | 2000-313955 A | | 11/2000 |
| JP | 2001-059170 A | | 3/2001 |
| JP | 2001-098366 A | | 4/2001 |
| JP | 2001-123266 A | | 5/2001 |
| JP | 2001-123267 A | | 5/2001 |
| JP | 2001-342505 A | | 12/2001 |
| JP | 2001-342559 A | | 12/2001 |
| JP | 2004-162109 A | | 6/2004 |
| JP | 2004-363541 A | | 12/2004 |
| WO | 00/40769 A1 | | 7/2000 |
| WO | 2006/059429 A1 | | 6/2006 |
| WO | 2006/067937 A1 | | 6/2006 |
| WO | 2006/077692 A1 | | 7/2006 |

OTHER PUBLICATIONS

One page English Abstract of JP 2001-098366, Apr. 10, 2001.
One page English Abstract of JP 2001-123266, May 8, 2001.
One page English Abstract of JP 10-081962, Mar. 31, 1998.
One page English Abstract of JP 2001-123267, May 8, 2001.
One page English Abstract of JP 2000-129316, May 9, 2000.
One page English Abstract of JP 2000-169960, Jun. 20, 2000.

* cited by examiner

SB-TE BASE ALLOY SINTER SPUTTERING TARGET

BACKGROUND OF THE INVENTION

The present invention relates to an Sb—Te base alloy sinter sputtering target containing carbon or boron and capable of effectively inhibiting the generation of particles.

In recent years, a thin film formed from an Sb—Te base material is being used as a phase change recording material; that is, as a medium for recording information by using phase transformation. As a method of forming this thin film formed from the Sb—Te base alloy material, it is standard to use a means generally referred to as a physical vapor deposition method such as the vacuum deposition method or the sputtering method. In particular, the thin film is often formed using the magnetron sputtering method from the perspective of operability and film stability.

Formation of films by way of the sputtering method is performed by physically colliding positive ions such as Ar ions to a target disposed on a cathode, using that collision energy to discharge materials configuring the target, and laminating a film having roughly the same composition as the target material on the opposite anode-side substrate.

The coating method based on the sputtering method is characterized in that it is possible to form films of various thicknesses; for instance, from a thin film of angstrom units to a thick film of several ten $\mu$m, with a stable deposition speed by adjusting the processing time, power supply and the like.

When forming a film formed from an Sb—Te base alloy material for use in a phase change recording film, specific problems arise including the generation of particles during sputtering or the generation of nodules (projections) that cause abnormal discharges (micro arcing) or the formation of clustered thin films (i.e., thin films in which nodules are solidified and attached), the generation of cracks or fractures in the target during the sputtering process, and the absorption of large amounts of gas components such as oxygen during the production process of sintered powder for use in a target.

These problems encountered in targets and during the sputtering process will become a significant cause of deteriorating the quality of the thin film as the recording medium.

It is known that the foregoing problems are largely affected by the grain size of the sintering powder or the target structure or shape. Nevertheless, since the target obtained by sintering is unable to retain sufficient characteristics upon producing an Sb—Te base alloy sputtering target for forming a phase change recording layer, it was not conventionally possible to avoid the generation of particles, abnormal discharge and nodules during the sputtering process, the generation of cracks or fractures in the target during the sputtering process, and the inclusion of large amounts of gas components such as oxygen contained in the target.

As a conventional method of producing an Sb—Te base sputtering target, disclosed is a production method of a Ge—Sb—Te base sputtering target, which is to prepare quenched powders of Ge—Te alloy and Sb—Te alloy by using the inert gas atomization technique, evenly mix the alloys having a Ge/Te ratio of 1/1 and a Sb/Te ratio between 0.5 to 2.0, and thereafter perform pressure sintering (for instance, refer to Patent Document 1).

In addition, disclosed are a production method of a Ge—Sb—Te base sputtering target wherein the oxygen content of a sintered compact, obtained by pouring the powder of which the tap density (relative density) is 50% or higher among various alloy powders containing Ge, Sb and Te into a mold, performing cold or hot pressurization thereto, and sintering a molding material of which the density after the cold pressurization is 95% or higher via heat treatment in an Ar or vacuum atmosphere, is 700 ppm or less; and a technology pertaining to a method of producing powder to be used therein by the atomization technique (for instance, refer to Patent Document 2).

In addition, disclosed is a production method of a Ge—Sb—Te base sputtering target material, which is to prepare quenched powder of a raw material containing Ge, Sb and Te by using the inert gas atomization technique, use the powder of which the grain size is 20 $\mu$m or greater and the specific surface area per unit weight is 300 $mm^2/g$ or less to perform cold or hot pressure molding, and sinter the compact obtained by such molding (for instance, refer to Patent Document 3).

As other technologies of producing a target using atomized powder, there are the following Patent Documents 4, 5, and 6.

Nevertheless, in the foregoing Patent Documents, the atomized powder is used as is. It is not possible to obtain a sufficient strength of the target, and it cannot be said that the miniaturization and homogenization of the target structure have been achieved. In addition, the tolerable oxygen content is high, and there is a problem in that it is insufficient as an Sb—Te base sputtering target for forming a phase change recording layer.

Moreover, there is also known a sputtering target for forming an optical disk recording film, in which the surface oxide film or the processing layer is eliminated and the average centerline roughness as the surface roughness is Ra≤1.0 $\mu$m (refer to Patent Document 7). The object of this target is to shorten the pre-sputtering time or to eliminate the pre-sputtering process entirely, and this method is extremely effective for achieving this object.

Nevertheless, with recent DVDs and BDs (Blu-ray Discs), even higher densification is being achieved, and, in order to improve the production yield, it is extremely important to reduce the particles caused by the target.

Accordingly, as well as the shortening of the pre-sputtering process, it is necessary to improve not only the quality of the target surface but the quality of the overall target in order to effectively inhibit the generation of particles, abnormal discharge and nodules, and the generation of cracks or fractures in the target.

Moreover, recently there have been proposals of reducing the load on the circuit by increasing the electrical resistance of the phase change recording film, reducing the current value flowing during the writing and erasing operation, and reducing the power consumption. As one such method, a proposal has been made for mixing carbon powder into the sputtering target to achieve low resistance (refer to Patent Document 8). However, since carbon powder is nonmetal, if carbon is mixed into a conventional Sb—Te base alloy sputtering target, it rather becomes an addition of foreign matter. There has been a problem that carbon is not necessarily a favorable additive because this easily generates abnormal discharge during the sputtering process, the generation of particles increases, and cracks sometimes occur in the target.

[Patent Document 1] Japanese Patent Laid-Open Publication No. 2000-265262
[Patent Document 2] Japanese Patent Laid-Open Publication No. 2001-98366
[Patent Document 3] Japanese Patent Laid-Open Publication No. 2001-123266
[Patent Document 4] Japanese Patent Laid-Open Publication No. S10-81962
[Patent Document 5] Japanese Patent Laid-Open Publication No. 2001-123267

[Patent Document 6] Japanese Patent Laid-Open Publication No. 2000-129316

[Patent Document 7] Japanese Patent Laid-Open Publication No. 2000-169960

[Patent Document 8] Japanese Patent Laid-Open Publication No. 2004-363541

SUMMARY OF THE INVENTION

The present invention seeks to increase the electrical resistance of the phase change recording layer by adding carbon or boron to the Sb—Te base alloy sinter target for forming the phase change recording layer, and provides a target capable of overcoming the various problems described above; namely, the target capable of effectively inhibiting the generation of particles, abnormal discharge and nodules and the generation of cracks and fractions in the target during the sputtering process. In particular, the present invention provides an Sb—Te base alloy sinter sputtering target for forming a phase change recording layer formed from Ag—In—Sb—Te alloy or Ge—Sb—Te alloy.

As a technical means for overcoming the foregoing problems, the present inventors discovered that it is necessary to devise the powder property and the structure and characteristics of the target in order to obtain a stable and homogenous phase change recording layer.

Based on the foregoing discovery, the present invention provides:

1) An Sb—Te base alloy sinter sputtering target, the Sb—Te base alloy sinter sputtering target having Sb and Te as its primary component wherein the target comprises a structure in which Sb—Te base alloy particles are surrounded by fine carbon or boron particles, and wherein, if the mean diameter of the Sb—Te base alloy particles is X and the particle size of carbon or boron is Y, Y/X is within the range of 1/10 to 1/10000;
2) The Sb—Te base alloy sinter sputtering target according to 1) above wherein gas atomized powder is used as the raw material of the Sb—Te base alloy sintered compact excluding carbon or boron;
3) The Sb—Te base alloy sinter sputtering target according to 1) or 2) above wherein the content of carbon or boron is 0.1 to 10 at %;
4) The Sb—Te base alloy sinter sputtering target according to any one of 1) to 3) above wherein the target contains one or more elements selected from Ag, In, Ga, Ti, Au, Pt and Pd in an amount up to 20 at %; and
5) The Sb—Te base alloy sinter sputtering target according to any one of 1) to 4) above wherein the target contains one or more elements selected from Ag, In, Ge, Ga, Ti, Au, Pt and Pd in an amount up to 30 at %.

With the Sb—Te base alloy sintered compact of the present invention, since it is possible to inhibit the coarsening of the added carbon or boron which is nonmetal, it yields a superior effect of preventing abnormal discharge originated from such carbon or boron and inhibiting the generation of particles caused by arcing. Moreover, although machining such as cutting work is performed at the stage of finishing the target, if there is coarsened carbon or boron, it might cause the generation of cracks and the like, and the generation of particles originated from these cracks could also be considered. The present invention is able to achieve a considerable effect of preventing the foregoing problems from occurring.

DETAILED DESCRIPTION OF THE INVENTION

Figure 1:
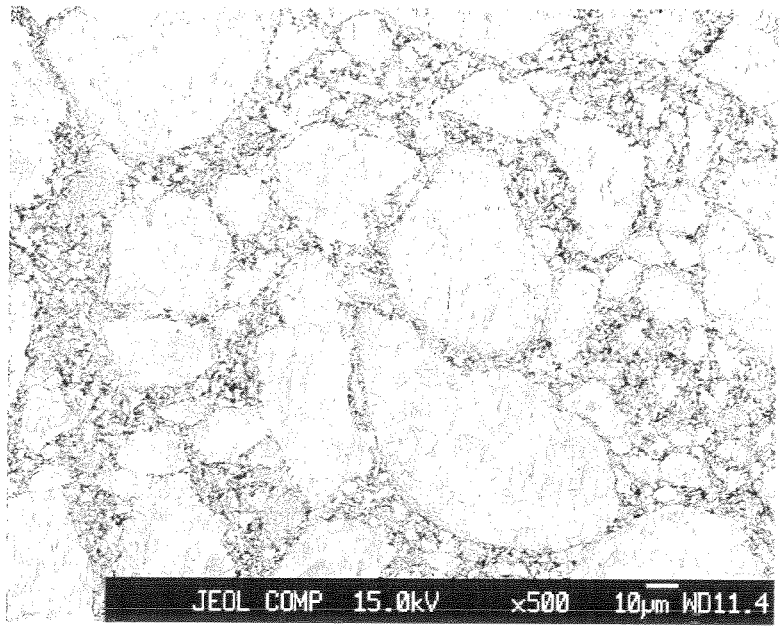
FIG. 1 shows an SEM photograph of the target surface of Example 2.

The present invention enables to obtain a sinter sputtering target by using gas atomized powder or machine pulverized powder of the Sb—Te base alloy to sinter.

Generally speaking, since gas atomized powder can be made to be an extremely fine powder in comparison to machine pulverized powder and it is possible to prevent the contamination caused by the use of a pulverizing machine, it is desirable to use gas atomized powder as is as the sintering powder. A target obtained by sintering the gas atomized powder has a small surface roughness Ra of 0.1 µm or less and, as described later, has superior characteristics in comparison to machine pulverized powder.

Nevertheless, so as long as the conditions of the present invention are satisfied, there is no particular problem in using machine pulverized powder. Upon performing machine pulverization, it is desirable to perform such machine pulverization in an inert atmosphere in order to reduce the oxygen content. A vibratory ball mill or the like may be used for the machine pulverization.

A significant feature of the Sb—Te base alloy sinter sputtering target of the present invention is that it comprises a structure in which Sb—Te base alloy particles are surrounded by fine carbon (C) or boron (B) particles.

If there are coarsened carbon or boron particles of 1 µm or larger, in particular 10 µm or larger, arcing will occur easily from such coarsened carbon or boron particles as the source, and it will cause the generation of particles. This tendency will not have a much influence when the particle size of carbon or boron is not so large, but the adverse effect will increase as the particle size of carbon or boron is coarsened.

In particular, the generation of particles tends to become greater when the diameter of the Sb—Te base alloy particles and the particle size of carbon or boron are close. In other words, if the ratio of the diameter of the Sb—Te base alloy particles and the particle size of carbon or boron is sufficiently large, an effect is yielded in significantly inhibiting the generation of arcing and particles.

Based on intense study, the present inventors discovered that, if the mean diameter of the Sb—Te base alloy particles is set to X and the particle size of carbon or boron is set to Y and if Y/X is within the range of 1/10 to 1/10000, it is possible to effectively inhibit the generation of arcing and particles.

In a case where the Y/X exceeds 1/10, the effect of inhibiting the generation of arcing and particles is low. Moreover, in a case where the Y/X is smaller than 1/10000, there is a problem in that the production will become substantially difficult. Accordingly, it is preferably to keep the value within the foregoing range. Further, although the Sb—Te base alloy particles will not have a significant effect, it is desirable that they are of a uniform structure in which the average crystal grain size of the Sb—Te base alloy particles is 500 µm, preferably 100 µm or less, and more preferably 50 µm or less.

In many cases, coarsened Sb—Te base alloy particles are accompanied by small Sb—Te base alloy particles, and the mixture of coarsened Sb—Te base alloy particles and small Sb—Te base alloy particles will cause an uneven structure. Thus, such unevenness will similarly cause the generation of arcing and particles.

Moreover, by reducing the crystal grain size of the target, it is possible to keep the surface of the eroded target smooth even after the erosion, and there is an advantage that it is possible to inhibit the adhesion of redepositions onto the asperity arising on the eroded surface, the growth of such redepositions into nodules, and the generation of particles caused by the collapse of such nodules.

In addition, when producing a target based on the foregoing conditions, the selection and mixture of carbon or boron and the adjustment of the production conditions of their sintered compact are important. Nevertheless, if the foregoing Y/X can be adjusted to be within the range of 1/10 to 1/10000, it should be understood that there is no particular limitation on the foregoing production process.

Consequently, a preferable condition is that gas atomized powder is used as the raw material of the Sb—Te base alloy sintered compact excluding carbon or boron. In addition, it is desirable that the content of the carbon or boron to be added is 0.1 to 10 at %. If the additive content is less than 0.1 at %, the effect of addition will be lost, and, if the additive content exceeds 10 at %, this is undesirable since the resistance will increase and it will cause the function of the phase change recording layer to deteriorate.

Further, the Sb—Te base alloy sinter sputtering target of the present invention may contain, as an accessory component, one or more elements selected from Ag, In, Ge, Ga, Ti, Au, Pt, and Pd in an amount up to 30 at %. In order to yield the additive effect, the additive amount is usually set to 15 at % or higher. The Sb content is also added at to 30 at %, and the remnant is Te.

When including, as an additive element, one or more elements selected from Ag, In, Ge, Ga, Ti, Au, Pt, and Pd in an amount up to 30 at %, it is possible to obtain the intended glass transition point or transformation speed. In particular, a target formed from Ag—In—Sb—Te alloy or Ge—Sb—Te alloy containing carbon or boron is an effective component for forming the phase change recording layer.

Although the following are not primary requirements of the present invention, as an additional condition, the surface roughness Ra can be set to 0.4 μm or less, the purity excluding gas components can be set to 4N or higher, and the content of gas components as impurities can be set to 1500 ppm or less. Since the target surface roughness strongly affects the existence of surface defects, if the surface roughness is great, it means that there is a surface defect including the work-affected layer in the background. A surface defect including the work-affected layer will lead to the generation of numerous cracks. Although it appears superficially that there is no direct relationship between the surface roughness and the surface defect, there are hidden surface defects in the surface roughness.

As a resulting of setting the surface roughness Ra to 0.4 μm or less, it is possible to eliminate nearly all surface defects including this kind of work-affected layer from the target, and there is an advantage that it is possible to prevent the generation of cracks in the target, and more effectively inhibit the generation of particles caused by the cracks.

In addition, by increasing the purity of the Sb—Te base alloy sinter sputtering target, such impurities as oxides other than the primary component or the additive accessory component will become the source of abnormal discharge (arcing). The present invention has a purity of 4N or higher, and is capable of effectively preventing the arcing caused by such impurities and further capable of inhibiting the generation of particles caused by such arcing. Desirably, the purity is 5N or higher.

In addition, it is desirable that the content of gas components as impurities is set to 1500 ppm or less. The inclusion of gas components such as oxygen, nitrogen and carbon could easily become the cause of the generation of impurities such as oxides, nitrides and carbides. The reduction of the foregoing impurities will lead to the prevention of arcing, and the inhibition of the generation of particles caused by such arcing.

As described above, with the Sb—Te base alloy sintered compact of the present invention, since it is possible to inhibit the coarsening of the added carbon or boron which is nonmetal, it yields a superior effect of preventing abnormal discharge originated from such carbon or boron and inhibiting the generation of particles caused by arcing.

Moreover, although machining such as cutting work is performed at the stage of finishing the target, if there is coarsened carbon or boron, it might cause the generation of cracks and the like, and the generation of particles originated from these cracks could also be considered. The present invention is able to achieve a considerable effect of preventing the foregoing problems from occurring.

As described above, the phase change target having a crystal structure according to the present invention yields the effect of reducing the surface asperity caused by the sputter erosion and inhibiting the generation of particles caused by detachment of the redeposited film on the target surface. Moreover, with the foregoing structure, there are also advantages that the composition variation of the sputtered film in the plane and between lots can be inhibited and the quality of the phase change recording layer can be stabilized. Additional effects are yielded in that the generation of particles, abnormal discharge and nodules can be effectively inhibited during the sputtering process as described above.

With the Sb—Te base sputtering target of the present invention, the content of gas components such as oxygen may be additionally set to 1500 ppm or less, preferably to 1000 ppm or less, and more preferably to 500 ppm or less. The reduction of gas components such as oxygen yields an advantage of being able to further reduce the generation of particles and the generation of abnormal discharge.

EXAMPLES

The present invention is now explained in detail with reference to the Examples. These Examples are merely illustrative, and the present invention shall in no way be limited thereby. In other words, various modifications and other embodiments based on the technical spirit claimed in the claims shall be included in the present invention as a matter of course.

Example 1

Ag, In, Sb and Te powder raw materials each having a purity of 4N or higher excluding gas components were mixed and synthesized to achieve an $Ag_5In_5Sb_{70}Te_{20}$ alloy, and this was subject to machine pulverization in an inert atmosphere. Consequently, as shown in Table 1, powder having an average grain size (X) of 8.0 μm was obtained.

Subsequently, this was divided into the four types of (1), (2), (3) and (4), and each of the four types of powders was mixed with 5 at % of the carbon powders having the average particle sizes (Y) of 30 nm, 50 nm, 7 nm and 750 nm respectively, as shown in Table 1, and then hot pressed. Each of the obtained sintered compact was subject to machining, and additionally subject to polishing to obtain an $Ag_5In_5Sb_{70}Te_{20}$ alloy target containing a prescribed amount of carbon.

The obtained alloy target comprised a structure in which the Sb—Te base alloy particles were surrounded by fine carbon particles. Table 1 shows the ratio of Y/X and the density. No generation of cracks in the target could be acknowledged.

This target was used to perform sputtering on a 200 mmϕ Si wafer. Consequently, arcing was not occurred, and the number of particles generated when sputtering was performed up to 10 kWhr and up to 100 kWhr is shown in Table 1.

As shown in Table 1, the number of particles of 0.3 μm or larger that were formed on the 200 mmϕ Si wafer when sputtering was performed up to 10 kWhr and up to 100 kWhr was ≤40 particles in (1), ≤40 particles in (2), ≤10 particles in (3), and ≤40 particles in (4), and superior targets were obtained. Among the above, (3) showed the most favorable result.

The case of (3) above was a case where the average grain size of carbon was the smallest at 7 nm, and it can be understood that the smaller the average grain size of carbon, the higher the effect of inhibiting the generation of particles.

TABLE 1

| Particle Evaluation: Number of Particles of 0.3 μm or larger on 200 mm ϕ Wafer | | | | |
|---|---|---|---|---|
| Example 1 | (1) | (2) | (3) | (4) |
| Grain Size of Alloy (μm) X | 8.0 | 8.0 | 8.0 | 8.0 |
| C Grain Size (nm) Y | 30 | 50 | 7 | 750 |
| Ratio Y/X | 3.75/1000 | 6.25/1000 | 8.75/10000 | 9.38/100 |
| Density g/cc | 6.2 | 6.2 | 6.1 | 6.2 |
| Particle Count | ≤40 | ≤40 | ≤10 | ≤40 |

Example 2

$Ge_{22.2}Sb_{22.2}Te_{55.6}$ alloy raw material was injected at 780° C. with a gas atomization device using argon (100 kgf/cm$^2$) as the injection gas to prepare atomized powder. Consequently, fair spherical powder was obtained.

From this gas atomized powder, as shown in Table 2, powder having an average grain size (X) of 32.0 μm was obtained. Subsequently, this was divided into the four types of (1), (2), (3) and (4), and each of the four types of powders was mixed with 5 at % of the carbon powders having the average particle sizes (Y) of 30 nm, 50 nm, 7 nm and 750 nm respectively, as shown in Table 2, and then hot pressed.

Each of the obtained sintered compact was subject to machining, and additionally subject to polishing to obtain a $Ge_{22.2}Sb_{22.2}Te_{55.6}$ alloy target containing a prescribed amount of carbon. Table 2 shows the ratio of Y/X and the density.

The SEM photograph of the obtained target surface is shown in FIG. 1. As shown in FIG. 1, no defects such as cracks can be observed, and the obtained target comprises a structure in which the Sb—Te base alloy particles were surrounded by fine carbon or boron particles.

As shown in Table 2, the number of particles of 0.3 μm or larger that were formed on the 200 mmϕ Si wafer when sputtering was performed up to 10 kWhr and up to 100 kWhr was ≤40 particles in (1), ≤40 particles in (2), ≤40 particles in (3), and ≤40 particles in (4), and superior targets were obtained. In the case of Example 2, the grain size of the $Ge_{22.2}Sb_{22.2}Te_{55.6}$ alloy was 32.0 μm and is slightly large in comparison to Example 1, but the number of generated particles was roughly the same.

TABLE 2

| Particle Evaluation: Number of Particles of 0.3 μm or larger on 200 mm ϕ Wafer | | | | |
|---|---|---|---|---|
| Example 2 | (1) | (2) | (3) | (4) |
| Grain Size of Alloy (μm) X | 32.0 | 32.0 | 32.0 | 32.0 |
| C Grain Size (nm) Y | 30 | 50 | 7 | 750 |
| Ratio Y/X | 9.38/10000 | 1.56/1000 | 2.19/10000 | 2.34/100 |
| Density g/cc | 6.2 | 6.2 | 6.1 | 6.2 |
| Particle Count | ≤40 | ≤40 | ≤40 | ≤40 |

Comparative Example 1

$Ge_{22.2}Sb_{22.2}Te_{55.6}$ alloy raw material was injected at 780° C. with a gas atomization device using argon (100 kgf/cm$^2$) as the injection gas to prepare two types of atomized powder. From these gas atomized powders, as shown in Table 3, (1) and (2) as powder having an average grain size (X) of 8.0 μm, and (3) and (4) as powder having an average grain size (X) of 32.0 μm were obtained. Each of these four types of alloy powders was mixed with 5 at % of carbon powders having the average particle sizes (Y) of 8.8 nm, 33.0 nm, 8.8 nm and 33.0 nm respectively, as shown in Table 3, and then hot pressed.

Each of the obtained sintered compact was subject to machining, and additionally subject to polishing to obtain a $Ge_{22.2}Sb_{22.2}Te_{55.6}$ alloy target containing a prescribed amount of carbon. Table 3 shows the ratio of Y/X and the density. This ratio of Y/x does not satisfy the conditions of the present invention, and the diameter of the carbon particles increased.

Figure 2:
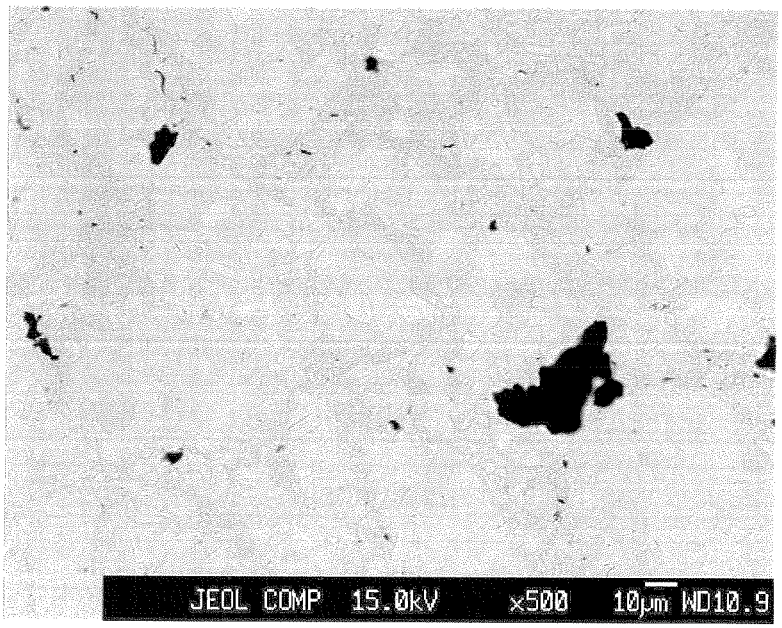
FIG. 2 shows an SEM photograph of the target surface of Comparative Example 1.

The SEM photograph of the obtained target surface is shown in FIG. 2. As shown in FIG. 2, although no defects such as cracks can be observed, fine carbon particles do not exist in the periphery of the Sb—Te base alloy particles, and carbon that coarsened in a dot shape was observed.

As shown in Table 3, the number of particles of 0.3 μm or larger that were formed on the 200 mmϕ Si wafer when sputtering was performed up to 10 kWhr and up to 100kWhr was >40 particles in (1), >200 particles in (2), >40 particles in (3), and >40 particles in (4). Many particles were generated and inferior targets as with the conventional technology were obtained.

TABLE 3

| Particle Evaluation: Number of Particles of 0.3 μm or larger on 200 mm ϕ Wafer | | | | |
|---|---|---|---|---|
| Comparative Example 1 | (1) | (2) | (3) | (4) |
| Grain Size of Alloy (μm)X | 8.0 | 8.0 | 32.0 | 32.0 |
| C Grain Size (μm)Y | 8.8 | 33.0 | 8.8 | 33.0 |
| Ratio Y/X | 1.1 | 4.13 | 2.75/10 | 1.03 |
| Density g/cc | 6.1 | 6.0 | 6.2 | 6.1 |
| Particle Count | >40 | >200 | >40 | >40 |

Although Examples 1 and 2 and Comparative Example 1 explained cases of using carbon (C), it has been confirmed that, when adding boron (B), the same operation and effect could be obtained as in the case of adding carbon. In addition, although the foregoing Examples explained cases of adding carbon to obtain $Ag_5In_5Sb_{70}Te_{20}$ alloy and $Ge_{22.2}Sb_{22.2}Te_{55.6}$ alloy target, the same effects were yielded in the addition of carbon or boron when adding one or more elements selected from Ag, In, Ge, Ga, Ti, Au, Pt and Pd as an accessory component.

With the Sb—Te base alloy sintered compact of the present invention, since it is possible to inhibit the coarsening of the added carbon or boron which is nonmetal, it yields a superior effect of preventing abnormal discharge originated from such carbon or boron and inhibiting the generation of particles caused by arcing. Moreover, although machining such as cutting work is performed at the stage of finishing the target, if there is coarsened carbon or boron, it might cause the generation of cracks and the like, and the generation of particles originated from these cracks could also be considered. The present invention is able to achieve a considerable effect of preventing the foregoing problems from occurring. Thus, the present invention is extremely effective for use as a phase change recording material; that is, as a medium for recording information by using phase transformation.

The invention claimed is:

1. An Sb—Te-based alloy sintered sputtering target, comprising Sb and Te as primary components of the sputtering target and a sintered structure in which particles of an Sb—Te-based alloy are surrounded by fine carbon or boron particles, wherein the Sb—Te-based alloy particles have a mean diameter of X, the carbon or boron particles have a mean diameter of Y, and Y/X is within the range of 1/10 to 1/10000, wherein the Sb—Te-based alloy particles consist of an Ag—In—Sb—Te alloy, and wherein a content of carbon or boron in the sputtering target is 0.1 to 10 at %.

2. The Sb—Te-based alloy sinter sputtering target according to claim 1 wherein gas atomized powder is used as the raw material of the Sb—Te-based alloy sintered compact excluding carbon or boron.

3. The Sb—Te-based alloy sinter sputtering target according to claim 2, wherein the target contains Ag and In in an amount up to 30 at %.

4. The Sb—Te-based alloy sinter sputtering target according to claim 3, wherein the target is used for forming a phase change recording layer formed from Ag—In—Sb—Te alloy containing carbon or boron.

5. The Sb—Te-based alloy sinter sputtering target according to claim 1, wherein the target contains Ag, and In in an amount up to 30 at %.

6. The Sb—Te-based alloy sinter sputtering target according to claim 1, wherein the target is used for forming a phase change recording layer formed from Ag—In—Sb—Te alloy containing carbon or boron.

7. The Sb—Te-based alloy sinter sputtering target according to claim 1, wherein the mean diameter of the Sb—Te based alloy particles are 8 µm to 32 µm and the mean diameter of the fine carbon or boron particles is 7 nm to 750 nm.

8. The Sb—Te-based alloy sinter sputtering target according to claim 7, wherein the mean diameter of the fine carbon or boron particles is 7 nm.

9. An Sb—Te-based alloy sintered sputtering target, comprising an Sb—Te-based alloy sintered sputtering target having Sb and Te as primary components and a structure in which Sb—Te-based alloy particles are surrounded by fine boron particles, a mean diameter of the Sb—Te-based alloy particles being X and an average particle size of the fine boron particles being Y, and Y/X being within the range of 1/10 to 1/10000, the Sb—Te-based alloy particles consisting of an Ag—In—Sb—Te alloy, and a content of boron within the sputtering target being 0.1 to 10 at %.

10. The Sb—Te-based alloy sinter sputtering target according to claim 9, wherein the target contains Ag and In in an amount up to 30 at %.

11. The Sb—Te-based alloy sinter sputtering target according to claim 9, wherein the Sb—Te-based alloy particles are made of $Ag_5In_5Sb_{70}Te_{20}$.

12. The Sb—Te-based alloy sinter sputtering target according to claim 1, wherein the Sb—Te-based alloy particles are made of $Ag_5In_5Sb_{70}Te_{20}$.

* * * * *